(12) United States Patent
Wood et al.

(10) Patent No.: US 10,110,006 B2
(45) Date of Patent: Oct. 23, 2018

(54) MANAGEMENT OF BATTERY CAPACITY (71) Applicant: East Penn Manufacturing Co., Lyon Station, PA (US)

(72) Inventors: John Wood, Sydney (AU); Brian McKeon, Sydney (AU)

(73) Assignee: East Penn Manufacturing Co., Lyon Station, PA (US)

( * ) Notice: Subject to any disclaimer, the term of this patent is extended or adjusted under 35 U.S.C. 154(b) by 701 days.

(21) Appl. No.: 14/511,711

(22) Filed: Oct. 10, 2014

(65) Prior Publication Data
US 2015/0021991 A1 Jan. 22, 2015

Related U.S. Application Data (63) Continuation of application No. PCT/AU2013/000375, filed on Apr. 12, 2013.

(30) Foreign Application Priority Data

Apr. 12, 2012 (AU) ................................ 2012901435

(51) Int. Cl.
*H02J 3/38* (2006.01)
*H02J 7/02* (2016.01)
*H02J 9/06* (2006.01)
*H02J 3/32* (2006.01)
*G01R 31/36* (2006.01)

(52) U.S. Cl.
CPC ...... *H02J 3/38* (2013.01); *H02J 3/32* (2013.01); *H02J 7/022* (2013.01); *H02J 9/062* (2013.01); *G01R 31/3624* (2013.01); *Y10T 307/344* (2015.04)

(58) Field of Classification Search
CPC ...... H02J 3/38; H02J 3/32; H02J 9/062; H02J 7/022; G01R 31/3624; Y10T 307/344
See application file for complete search history.

(56) References Cited

U.S. PATENT DOCUMENTS 7,593,823 B2  9/2009  Iwane et al.
7,839,027 B2  11/2010  Shelton et al.
(Continued)

FOREIGN PATENT DOCUMENTS

EP  2026440 A2  2/2009
JP  2001157382 A  6/2001
(Continued)

OTHER PUBLICATIONS

Australian Patent Examination Report No. 1, dated May 2, 2016, 3 pages.
(Continued)

*Primary Examiner* — Jared Fureman
*Assistant Examiner* — Michael Warmflash
(74) *Attorney, Agent, or Firm* — Barley Snyder (57) ABSTRACT Disclosed is a battery cell system, which provides regulation service to the grid, as well as the battery being used as part of an uninterruptible power supply (UPS). Part of the capacity of the storage batteries may be used for regulation service, while maintaining a reserve of battery capacity to provide the UPS supply if required. An advantage is that the battery installation can be more effectively monitored as it is more regularly being charged and discharged.

16 Claims, 4 Drawing Sheets

(56) References Cited

U.S. PATENT DOCUMENTS

| | | | |
|---|---|---|---|
| 2007/0282495 A1* | 12/2007 | Kempton | B60L 8/00 |
| | | | 701/22 |
| 2010/0003545 A1 | 1/2010 | Horne et al. | |
| 2011/0101779 A1* | 5/2011 | Patel | H02J 3/28 |
| | | | 307/64 |
| 2011/0115295 A1* | 5/2011 | Moon | H02J 3/32 |
| | | | 307/65 |
| 2011/0148205 A1 | 6/2011 | Moon | |
| 2013/0249289 A1* | 9/2013 | Patel | H02J 3/28 |
| | | | 307/26 |

FOREIGN PATENT DOCUMENTS

| | | |
|---|---|---|
| JP | 2002191126 A | 7/2002 |
| JP | 2009159730 A | 7/2009 |
| JP | 2010226942 A | 10/2010 |
| JP | 2001126431 A | 6/2011 |
| JP | 2011147329 A | 7/2011 |

OTHER PUBLICATIONS

Abstract of EP2026440, dated Feb. 18, 2009, 2 pages.

PCT Notification and International Preliminary Report on Patentability, Application No. PCT/AU2013/000375, dated Jun. 23, 2014, 12 pages.

PCT International Search Report, Application No. PCT/AU2013/000375, dated Jul. 24, 2013, 5 pages.

'Development of ultra-battery for hybrid-electric vehicle applications', L.T. Lam, R. Louey, Journal of Power Sources, vol. 158, Issue 2, Aug. 25, 2006, pp. 1140-1148.

Japanese Notification of Reasons for Refusal, dated Mar. 7, 2017, 11 pages.

Russian Search Report and English translation, dated Mar. 9, 2017, 8 pages.

Russian Notification of Invention Unity, dated Mar. 6, 2017, 6 pages.

English translation of the Notification of the Fourth Office Action, dated Feb. 23, 2018, 6 pages.

* cited by examiner

Figure 1

PRIOR ART

MANAGEMENT OF BATTERY CAPACITY

CROSS-REFERENCE TO RELATED APPLICATIONS

This application is a continuation of PCT International Application No. PCT/AU2013/000375 filed Apr. 12, 2013, which claims priority to Australian Application No. 2012901435 filed Apr. 12, 2012.

FIELD OF THE INVENTION

The present invention relates to use of back up battery capacity to provide power smoothing and power regulation services.

BACKGROUND

The supply of mains electricity in modern systems is provided by a complex interplay of generators, distribution and transmission. On the demand side, a similarly complex mix of customers requires variable levels of supply, in an uncoordinated manner. This all occurs in real time. Whilst generators will be contracted to supply certain levels of production for certain time periods during the day, and this is supplemented by supplies being brought on and off line with time scales of tens of minutes, the variability of demand means that the supplies and loads never exactly match. This results in generators increasing speed (frequency) when load is lower than generation and decreasing speed (frequency) when load exceeds generation output.

Regulation service corrects for short term changes in electricity demand, by assisting in matching generation output to demand, and in maintaining the desired frequency. These services may be up regulation, to provide extra power when demand exceeds capacity, or down regulation, when the generated capacity exceeds demand.

One way to provide regulation service is to vary the output of a fossil fuel generator around a set point, particularly gas fired turbines, due to their faster response compared to coal-fired plant. Another source of regulation service is pumped hydroelectric, in which generation output is varied about a base, set point, value. Other systems are known including compressed air and flywheels.

Another way to provide regulation services uses large storage batteries. During times of excess electricity supply, the batteries are charged. When additional output is required for regulation, a power converter is used to produce AC from the DC storage output. This can be done relatively quickly and with high reliability. Although efficient systems to accomplish this exist, there is still a relatively large capital cost associated with the battery system, control electronics, and power electronics for battery based systems.

It is an object of the present invention to provide regulation services in a more efficient way.

SUMMARY

In a first broad form, regulation services are provided using part of the capacity of a storage battery system, which is part of a backup supply for an Uninterruptible Power Supply (UPS) or similar system. Part of the capacity of the storage batteries may be used for regulation services, while maintaining a reserve of battery capacity to provide the backup supply if required.

According to one aspect, the present invention provides a method for providing selective electricity supply and storage from a backup battery system which is connected to the grid, the system including one or more storage batteries, a converter from AC to DC for charging the batteries, and a inverter from DC to AC for converting the current from discharging the batteries into AC, wherein the AC can be selectively supplied either for use as a backup supply or for external supply back to the grid, and wherein at least a portion of the batteries are allocated for use as both a backup supply and for supply back to the grid, a first part of the capacity of such batteries being designated for use as a backup supply, and a second part of the capacity of such batteries is designated as for use for selective charging from the external supply or discharging to the external supply.

A particular advantage of implementations of the present invention is that the battery hardware is regularly being charged and discharged, so that it can be monitored for performance and health, whereas a conventional UPS is exercised intermittently and the condition of the battery is unknown until it is called upon.

Another important advantage of the present invention is that it allows the UPS owner or operator to derive an additional revenue stream from the capital investment in storage batteries and associated electronics and other infrastructure. Whilst an additional battery capacity will be required, this is offset by the revenue which can be derived from providing regulation service to the electricity grid

BRIEF DESCRIPTION OF THE DRAWINGS

Illustrative implementations of the present invention will be described with reference to the accompanying drawings, in which.

DETAILED DESCRIPTION OF THE EMBODIMENTS

The present invention will be primarily described with reference to a lead acid battery implementation, more particularly a lead acid UltraBattery implementation. However, the principle of the present invention can be applied to other chemical storage systems, for example lithium polymer, lithium ion, sodium sulphide, nickel cadmium, or any other such chemical system. The principle could also be applied to other storage technologies such as supercapacitors and ultracapacitors. It can also be applied to combinations of any of these types of storage technologies. When the term battery is used throughout the description and claims, it is intended to extend to these types of batteries and storage systems, unless the context indicates otherwise.

It will be appreciated that the examples provided are intended as illustrative of implementations of the present invention, and should not be considered as limitative of the scope of the invention. Many alternative implementations are possible, as will be apparent to those skilled in the art.

Figure 1:
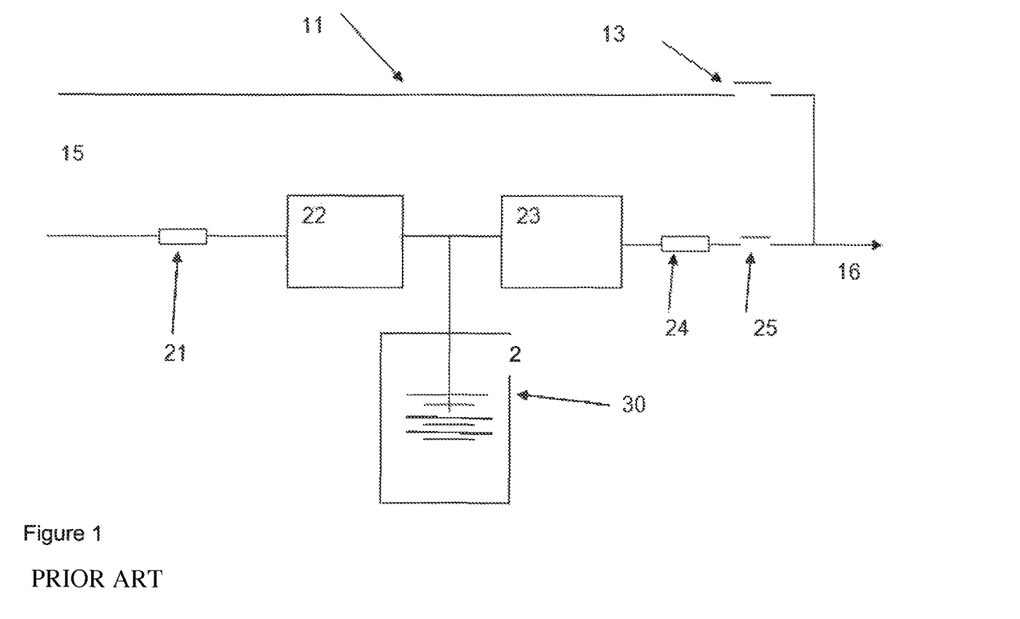
FIG. 1 is a typical on-line UPS circuit.

FIG. 1 illustrates a typical on-line UPS system, to which the present invention may be applied. Such a UPS takes an input from the supply, passes it through an input filter, and rectifies the AC to DC. This is used to charge the battery and also supply a subsequent DC to AC inverter to the datacentre or similar facility. When the incoming AC supply is lost then the battery output supplies the facility via the DC to AC inverter.

Referring to FIG. 1, and in more detail, the on-line UPS, includes an input line 15 from the mains electricity supply. It will be appreciated that this supply is of a rating sufficient for the facility in question, typically from a dedicated substation delivered as 3 phase power. On the principal path, after passing through fuse 21, the incoming AC is rectified by rectifier/charger 22. This is then input to charge the battery 30. The rectified output is also input to inverter 23. This produces AC, which is then output through fuse 24 and switch 25 to output 16, and subsequently to power the facility. In this arrangement, the inverter and rectifier are always on. There is also a maintenance bypass 11 and associated switch 13 to provide power when the UPS is off line for repair.

It will be understood by those skilled in the art that other UPS configurations are possible, for example using multiple battery modules, shared redundant systems, standby systems, and the like. The present invention could be applied to any of these, in a suitable implementation.

An advantage of this type of arrangement shown in FIG. 1 is that the AC power which is received by the facility has been rectified and then inverted, so that it is clean and avoids artefacts and current surges. Further, because the frequency and voltage are controlled by the inverter, the facility always receives high quality, within parameter AC. If the power supply fails, the inverter continues as before, but the energy comes from the battery. This also provides time for, for example, diesel or other local back up power generation to be brought on line, in the event of a prolonged outage. For a short outage, the power users in the facility will be unaware of any loss of incoming AC.

Such a backup facility is typically related to communication or digital processing hardware, for example a datacentre, communication exchange or cell tower, server farm or the like. Whilst the present invention is applicable in principle to a smaller operation, practical issues of scale suggest that it is most applicable to larger sites which have correspondingly larger battery capacity.

The general principle of the present invention is that the battery capacity is partly used to provide back up for the respective site, and partly to provide regulation service to the electrical grid. A sufficiently large battery is provided to allow for the backup capacity required, as well as the capacity to provide regulation services. The battery is generally provided as a large number of interconnected cells. It will be appreciated that the batteries could form a single unit or installation, or be distributed.

Figure 3:
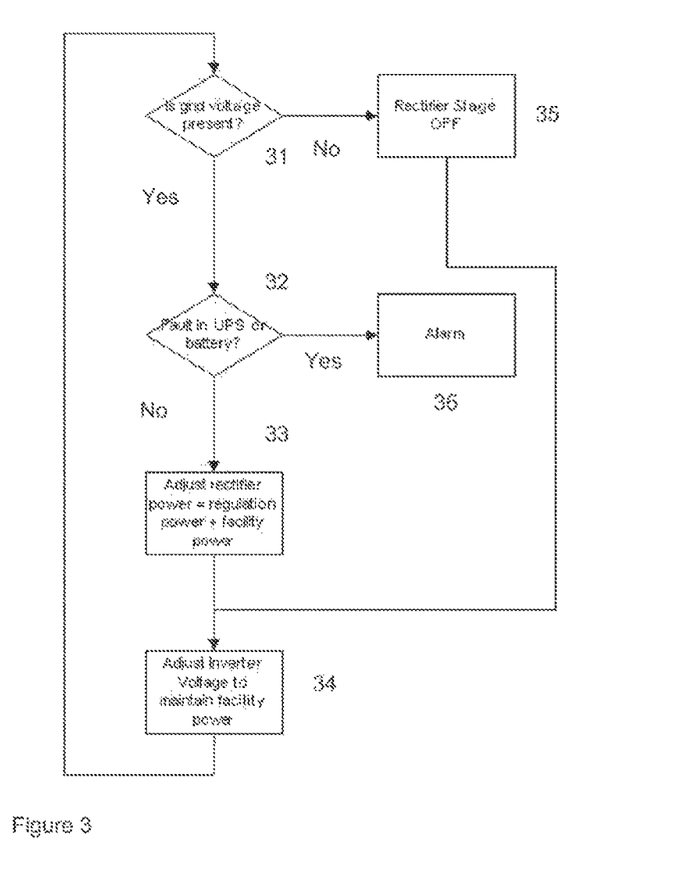
FIG. 3 is a flowchart illustrating one implementation of the present invention.

FIG. 3 is a flowchart illustrating the typical operation of a system according to an implementation of the present invention. At 31, the process determines whether grid voltage is present. If grid voltage is not present, then the rectifier stage is turned off 35 and the process proceeds to adjust the inverter voltage to maintain power.

If the grid voltage is present, at 32 the process checks whether there is a fault in the UPS or battery. If there is a fault, then an alarm state is triggered at 36. If not, then the process proceeds at 33 to adjust the rectifier power to provide regulation power plus the required facility power. Next, the inverter voltage is adjusted at 34 to maintain the required facility power, and the process returns to the start.

Figure 2:
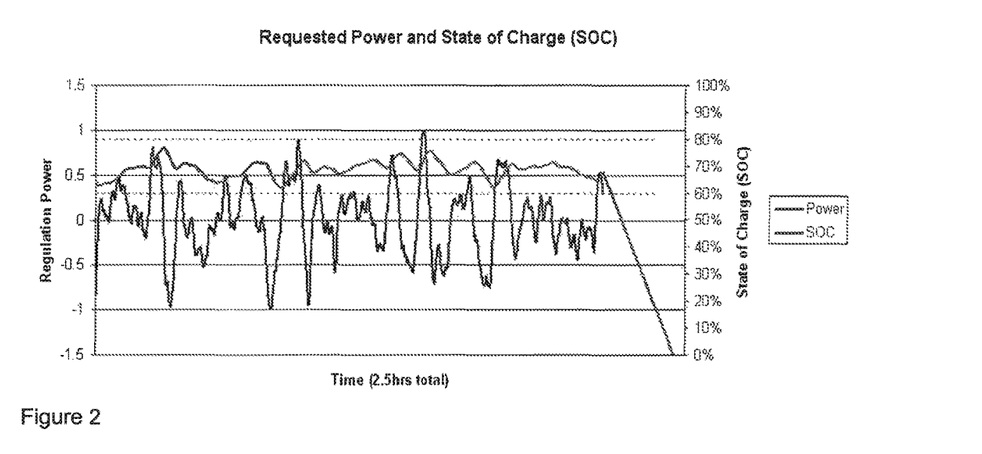
FIG. 2 is a graph of state of charge and power verses time for a notional battery system.

FIG. 2 illustrates the charge state (SOC) and requested power of a notional battery used according to the present invention over time. The left axis shows the regulation power in MW, and the right axis shows the % state of charge. It can be seen that the regulation power swings from positive to negative on a frequent basis, in order to provide the requested regulation for the grid. The charge state changes slowly, in the opposite direction and lagging the power curve. In this implementation, the base state of charge is around 70%.

The energy in the battery stored below the 60% level, indicated as a dotted line on the graph, is reserved for use for back-up power for the associated facility. Operation of the battery to provide regulation services thus causes the charge state to move up and down, but reserving 60% of capacity for back up services.

The graph shows an end point where the regulation signal is lost, because the grid connection has been lost. The SOC then declines and falls to zero over a period of typically 15 minutes while the battery supplies the backup power to the facility.

In a system according to implementations of the present invention, the operator of the UPS backup system would tender to provide regulation services of, say, +/−20 MW. The regulation services battery capacity is either charged or discharged to provide the regulation service, depending upon the regulation control signal. The latter varies with the electricity grid system. For example, a description of the PJM fast response regulation signal and sample signals can be found at http://pjm.com/markets-and-operations/ancillary-services/mkt-based-regulation.aspx#SliderItem1. Such systems form part of the background state of the grid and will be well understood by those skilled in the art, and so will not be further explained here.

In a typical implementation of the present invention, combined UPS and regulation service capacity would have the battery stored energy sitting at an average of about 70% of battery capacity. The stored energy might swing between 60% and 80% of capacity when supplying the regulation demand. The battery store is sized so that 60% of battery capacity would be sufficient to supply the facility power for the required backup time.

It will be appreciated that a customer would need an additional storage capacity relative to the backup power requirement alone, for example an additional 67% over the usual requirement. The power electronics of the DC-AC inverter remain largely identical however the power electronics of the AC-DC rectifier stage require increased capacity to handle the UPS base load plus the peak regulation demand.

It is usual to operate prior art UPS systems with cells at a fully-charged state, ready to provide back up power. However, the site owner does not know if a cell is not performing optimally until power is withdrawn. A prior art system may be tested with a discharge every few months, however, this does not provide as high an assurance as running the system components, including the battery, continuously as in the present invention. According to implementations of the present invention, the battery would be continually exercised at high power levels, so that an ongoing basis of assessment of health of cells of the battery can be obtained.

To operate in a partial State of Charge (SOC) of, for example, 60-80%, it is necessary to calculate SOC. A prior art assessment of cell SOC typically involves stopping charging the system, waiting a few hours for a stable voltage and using this as an estimator of state of charge. After this point coulombs charged or discharged are counted, scaled based on a cell capacity measure, and used to estimate a new SOC.

One problem with this technique is that the charge is determined by an integral of current, an integration process requires high accuracy current measurement, and this leads to accumulation of errors. It is therefore necessary to return to a stable voltage measure periodically so as to recalibrate the SOC. This recalibration requires the system to stop charging and discharging, and during this time it is unable to provide regulation services.

According to implementations of the present invention, the SOC of the cells can be measured while the system is running For any cell, the voltage is offset by an estimate of internal cell voltage. This is calculated as the cell current multiplied by a nominal impedance, typical of the cell in use, to get an estimate of "internal" cell voltage. The measured voltage is then filtered with a large time constant of 2-24 hrs to get an estimate of internal voltage. Current is also integrated to provide a charge measure and filtered with a high-pass time constant that is the same as the low pass value we use for cell voltage.

Our state of charge estimate combines the low-pass voltage SOC estimate with the high-pass integral of current SOC estimate to provide a net SOC estimate. The advantage of this method is that the system does not need to be stopped to recalibrate the SOC measure. A further advantage is that there is less emphasis on long-term integral of current as lower-accuracy, lower-cost, current measurement is sufficient.

Figure 5:
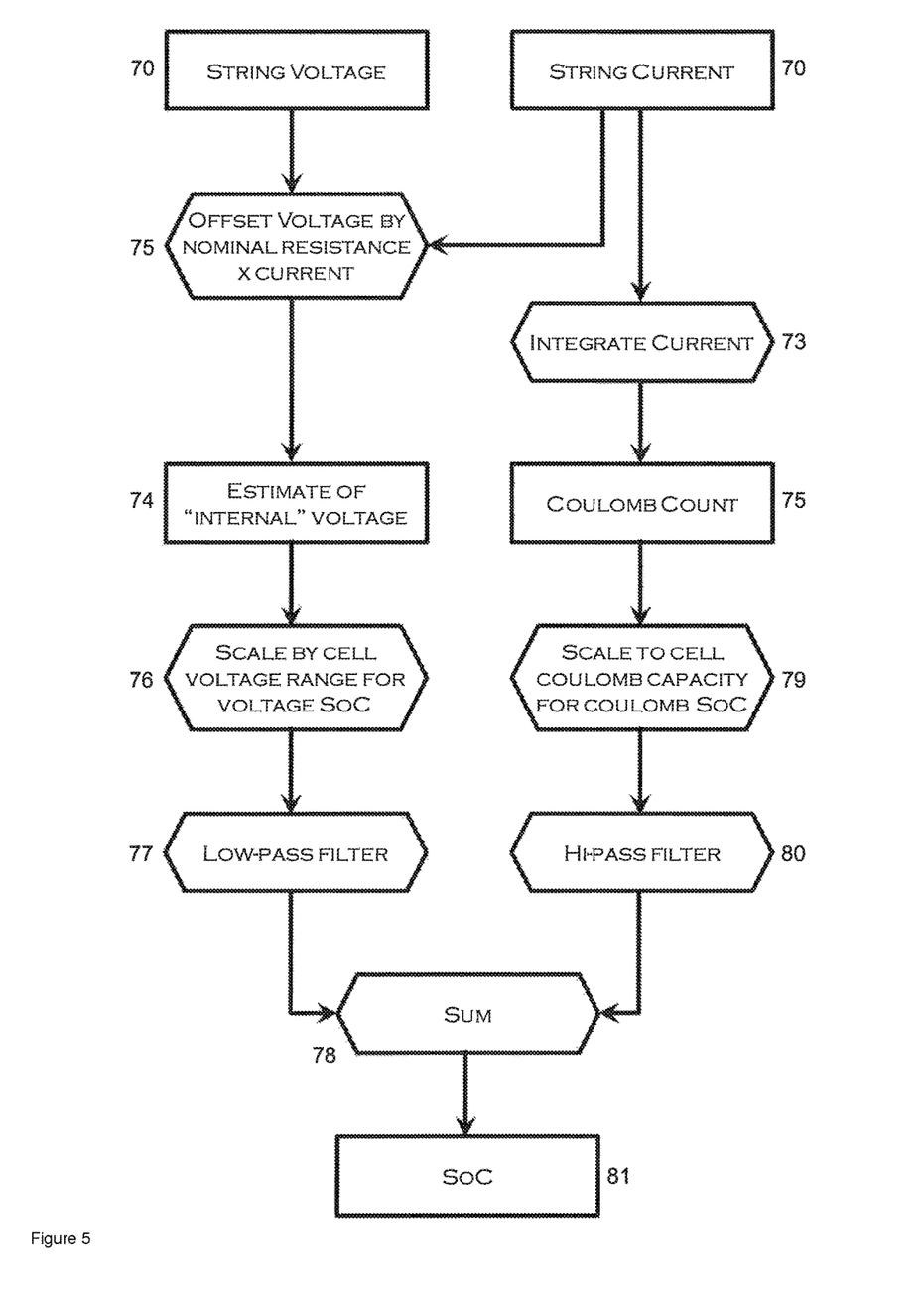
FIG. 5 is a flowchart showing a process for state of charge determination according to the present invention.

Referring to FIG. 5, string voltage 70 and string current 71 (from sensors as will be described below) provide inputs to the state of charge estimating process. String voltage is offset by the value of the nominal cell impedance multiplied by the string current at 72, which provides then an estimate of internal cell voltage 74. This is then scaled by cell voltage range for voltage state of charge at 76, and passed through a low pass filter 77.

In parallel, the integrated current 73 is processed to determine a charge count in Coulombs 75. This is scaled to the cell coulomb capacity for Coulomb state of charge, and passed through a high pass filter 80. The values from 77 and 78 are then summed 78 to provide the state of charge estimate 81.

In a preferred form, the SOC estimate makes allowance for the Peukert, effect, wherein a higher discharge rate will experience a higher internal impedance, and hence the battery is able to supply less total power under such conditions. In effect, drawing current at a higher rate will reduce the available capacity of the battery. In the SOC estimate, this effect is taken into account, so that faster discharge or charge is weighted more highly in the cumulative Ahr calculation.

In a further preferred form the filtering time constants are not fixed but are selected from pre-determined values of 2-24 hrs when the battery is loaded or 0.2-2 hrs if the battery is unloaded.

It will be appreciated that the value of 60-80% partial SOC is provided only by way of example, the present invention can in principle be implemented with any suitable partial SOC value which is desired and which is compatible with the battery and cell type and configuration.

Figure 4:
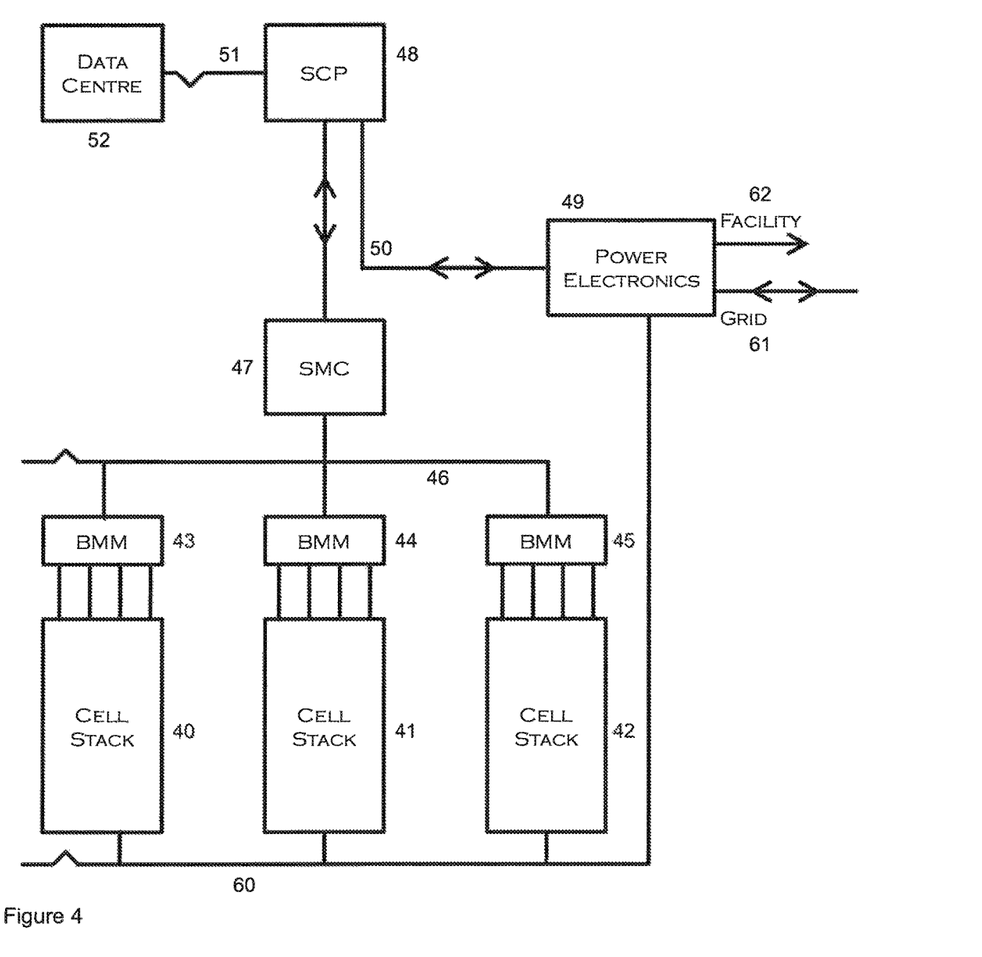
FIG. 4 is a block diagram showing an illustrative implementation of the present invention.

An example of a practical implementation of a system according to the present invention will now be described with reference to FIGS. 4. This system includes 160 by 2-cell modules of East Penn UltraBatteries, which can be packaged in two ISO shipping containers. Each stack of 32 cells 40, 41, 42 includes a Battery Monitoring Module (BMM) 43, 44, 45, atop each 32-cell stack 40,41,42. For the purposes of clarity, only three cellstacks are shown, but it will be apparent that in such a system, 10 stacks are required, each with an associated BMM.

The cell stacks 40, 41, 42 also have a DC connection 60, for example via a solid bus, to power electronics 49. The power electronics receives AC from the grid 61 and rectifies it for charging the cell stacks, inverts DC to provide AC power for the facility, and also outputs controlled AC (under instructions from SCP 48) when required to provide regulation services for the network.

Each BMM 43, 44, 45 is a micro-processor-controlled electronic module with 32 differential voltage inputs (for each individual cell) and 8 temperature sensor inputs (not shown). The temperature inputs allow for monitoring at sample sites within the 32 cell module. Each cell has its voltage individually monitored by the respective BMM.

The BMMs each include a CAN communications bus, which provides communications 46 back to a battery String Master Controller (SMC) 47. This allows for the set of BMMs to be controlled, so as to log cell voltages and temperatures at a desired sample rate, for example typically 1/sec. SMC 47 is conveniently an industrial packaged PC, and has an additional input from a string current sensor (not shown). This may conveniently be a Hioki 9709 Hall effect precision current sensor. The SMC will receive the various cell voltage inputs and string current (the same for all cells of a string) and calculate a string SOC and the SOC of individual cells using the method described above.

The system is controlled by a system control processor (SCP) 48. This communicates with SMC 47, power electronics 49 via data connection 50, and a remote datacentre 52 (or the like) via external data link 51.

In order to assess the state of health of a battery string, the following procedure may be used. Periodically, a battery string is taken off-duty by SCP 48, if necessary the string can be discharged to a pre-defined target SOC. It is allowed to rest for a period, and a power load is applied to the battery string, either via a load resistor or via the connected DC to AC converter. The BMMs are set to sample at a higher rate, typically 1 k/sec, and a set of samples are taken. For example, this may be a set of 100 samples, 50 prior to the load step and 50 after.

These samples are then plotted, and conventional curve and line fitting processes are used to define the voltage step amplitude seen for each cell. The observed voltage step is directly related to cell resistance and is a measure of the State of Health (SOH) of cells. This SOH measurement is logged to a datacentre 51 remote from the site and changes in SOH of cells are monitored over time to determine any trends indicating failing cells. For some installations with higher measurement noise levels the power supply to the BMMs can be isolated during the sensitive SOH measurement period. The internal power supply circuit of each BMM includes sufficient reserve to allow the BMM to continue operating during such periods of isolation.

The set of 320 cells is intended to provide 1 MW of UPS power for 10 minutes when starting from 60% of maximum energy storage. The 320 cells are also able to provide +/−0.5 MW of regulation power while operating in a 60-80% range of stored energy.

This 320-cell battery is connected to power electronics 49, for example a Liebert NXL1100kVA/1100 kW UPS power electronics with the input AC-DC rectifier stage of the power electronics increased by 50% in power capability.

On loss of the AC grid connection, SCP 48 will then stop the system providing the frequency regulation service, and the SCP then instructs the power electronics 49 to begin full load support from the cell stacks. This is conventional UPS operation where the battery is discharged for 5-10 minutes to support the system load. As an alternative implementation, on loss of AC connection, power electronics 49 would disconnect from the AC grid connection, ignore the SCP 48 input, and begin discharging the battery to support the load.

SCP 48 provides overall control of the system. It accepts a frequency regulation signal from a utility authority, for example, PJM in the Eastern USA, via a suitable interface device, in this case a SecureNet-RT interface module. It will be appreciated that the appropriate interface will be dependent upon the frequency regulation signal system which is appropriate for the location of the system.

The system controller then controls the Liebert NXL via a modbus interface to modulate the rectifier power level, satisfying the PJM regulation request together with the facility load via the DC-AC inverter. The Ecoult system controller also monitors the battery condition, voltage, temperature, SOC, from the SMC and may disable the frequency regulation function if battery conditions exceed boundary conditions. The Ecoult system controller further logs the different UPS and battery conditions and transmits the data to a datacentre remote from the UPS installation.

It will be further appreciated that while the present invention has been described in relation to specific hardware implementations for the UPS and the rectifier and inverter stages, many different alternatives are possible.

For example, instead of a UPS topology consisting of a rectifier stage, batteries, and a DC-AC inverter stage, a separate DC to AC output stage to the grid for regulation could be provided. However, this is not preferred, as power rectifier technology is typically significantly lower cost than inverter technology.

A further advantage of the present invention is that often there is more back up capacity than the portion of SOC reserved for that purpose. This is because in the event of a power outage, the network is inoperative and does not require regulation services. Any power stored can therefore be used for back up purposes. In other words, the minimum back up power available in implementations of the present invention will be the reserved back up capacity—in almost all situations, it will be greater than that reserved capacity.

The present invention may also be implemented purely as a demand response load. That is, the system operates only as a down regulation facility, and does not provide power back to the grid.

It is possible to implement the invention with the UPS of a datacentre segmented into two parts—one that is standard backup supply and another which is combined backup and regulation service. The latter would be preferably based on UltraBatteries. This allows the UltraBattery segment to provide a mix of regulation and UPS functionality that is optimised for cost/benefit without being constrained by the minimum and maximum power levels of the datacentre. The variation in datacentre demand would be managed by the standard UPS segment. For example, a 1.5 MW datacentre might be supplied by a 1 MW UltraBattery UPS and a 0.5 MW standard UPS. The 1 MW UltraBattery UPS would also provide 1 MW of regulation, maximising the regulation income, and would draw anywhere between 0 and 2 MW depending on the regulation signal. If the datacentre base load fell during the day from 1.5 MW to 1.1 MW the output from the conventional 0.5 MW UPS would be reduced to 0.1 MW so that the UltraBattery segment could continue to provide a 1 MW regulation service.

UltraBatteries for the purposes of the present invention are described, for example, in 'Development of ultra-battery for hybrid-electric vehicle applications', L. T. Lam, R. Louey, Journal of Power Sources, Vol 158, Issue 2, 25 Aug. 2006, Pages 1140-1148. They are also available commercially from East Penn, Inc.

While the present invention has been described with reference to a back-up system for a particular site, it may that the system is applied to multiple sites. Similarly, the battery capacity which is referred to need not be located on a common site, or even in geographical proximity. It is known to use virtual entities, being aggregations of loads or generators, or part thereof, to be controlled via the grid. Similarly, the present invention could be a virtual service provider, with a collection of storage facilities, perhaps of diverse types, which are commonly controlled to provide regulation services. Such a virtual service could be a mixture of generation, controlled battery storage such as described above, and other load and/or generation components, operated together to provide services to the grid and optimise efficiency and returns for the virtual operator.

Particularly advantageous virtual implementations may use distributed generation, together with storage provided as described above, in order to provide effective regulation, particularly when the distributed generation is wind, PV solar, or other intermittent generation sources.

What is claimed is:

1. A method for providing selective electricity grid modulation from a backup battery system for a facility which is connected to the grid, comprising:
   providing one or more batteries in the backup battery system;
   providing a converter for converting from AC to DC for charging the batteries from the grid, and an inverter for converting from DC to AC to supply the facility load and to selectively supply the grid;
   selectively connecting the inverter AC output to the grid and modulating to provide grid regulation;
   designating at least one of the one or more batteries for use as both a backup supply for said facility and for grid regulation;
   designating a first part of a capacity of said batteries for use as a backup supply;
   designating a second part of the capacity of said batteries for use for grid regulation; and
   selectively charging the second part from the grid via the converter, or selectively discharging the second part via the inverter to the grid, a peak power available to the second part is less than a peak facility load such that a total rectifier power always appears as a load from the grid connection, allowing participation in load management schemes.

2. A method according to claim 1, wherein between 50 and 70% of the capacity is used for said first part.

3. A method according to claim 2, wherein between 15 and 30% of the capacity is not used by either the first or second part, so as to optimise the life of said batteries.

4. A method according to claim 1, wherein the second part is used to provide regulation services, and wherein a controller is provided to control discharge and charge of said second part which is responsive to supply grid automated ancillary service messages.

5. A method according to claim 3, wherein said controller is further adapted to monitor and report on the status and health of said storage batteries.

6. A method according to claim 1, wherein the grid is used to charge the batteries on a continuous basis up to the first part of said capacity, and said first part is continuously discharged into an inverter, so as to provide normal operational power for the facility load.

7. A method according to claim 1, where the one-way direction of power flow allows the AC to DC rectifier stage to be implemented via lower-cost power electronics when compared to cost of a bi-directional AC to DC converter.

8. A method according to claim 1 where the grid regulation function requires a frequency regulation power, and the facility has a facility load, and the system has a peak battery recharging power, wherein the frequency regulation power plus the facility load is selected to be less than or equal to the peak battery recharging power, so that frequency regulation service and battery recharging needs following a power outage are exclusive, allowing the connection power requirements to be minimised.

9. A method according to claim 1 where the first part of the battery is provided by a technology adapted to support discharge for back-up battery charging, and the second part is provided by a technology adapted to provide frequent power, the system further including electronic switches for selecting which portion is connected to the AC to DC converter, depending on required function.

10. A method for providing selective electricity grid modulation from a backup battery system for a facility which is connected to the grid, comprising:
- providing one or more batteries in the backup battery system, the facility having a facility load and the system having a peak battery recharging power;
- providing a converter for converting from AC to DC for charging the batteries from the grid, and an inverter for converting from DC to AC to supply the facility load and to selectively supply the grid;
- selectively connecting the inverter AC output to the grid and modulating to provide grid regulation;
- designating at least one of the one or more batteries for use as both a backup supply for said facility and for grid regulation;
- designating a first part of a capacity of said batteries for use as a backup supply;
- designating a second part of the capacity of said batteries for use for grid regulation, the grid regulation function requires a frequency regulation power, the frequency regulation power plus the facility load is selected to be less than or equal to the peak battery recharging power so that frequency regulation service and battery recharging needs following a power outage are exclusive, allowing the connection power requirements to be minimised; and
- selectively charging the second part from the grid via the converter, or selectively discharging the second part via the inverter to the grid.

11. A method according to claim 10, wherein between 50 and 70% of the capacity is used for said first part.

12. A method according to claim 11, wherein between 15 and 30% of the capacity is not used by either the first or second part, so as to optimise the life of said batteries.

13. A method according to claim 10, wherein the second part is used to provide regulation services, and wherein a controller is provided to control discharge and charge of said second part which is responsive to supply grid automated ancillary service messages.

14. A method according to claim 12, wherein said controller is further adapted to monitor and report on the status and health of said storage batteries.

15. A method according to claim 10, wherein the grid is used to charge the batteries on a continuous basis up to the first part of said capacity, and said first part is continuously discharged into an inverter, so as to provide normal operational power for the facility load.

16. A method according to claim 10, wherein the first part of the battery is provided by a technology adapted to support discharge for back-up battery charging, and the second part is provided by a technology adapted to provide frequent power, the system further including electronic switches for selecting which portion is connected to the AC to DC converter, depending on required function.

* * * * *